Oct. 30, 1962 R. E. SCHLEGEL 3,061,762

UNIVERSAL LEAD MOUNTING

Filed June 7, 1960

INVENTOR.
ROBERT E. SCHLEGEL

BY R. E. Geangue

ATTORNEY

United States Patent Office 3,061,762

Patented Oct. 30, 1962

3,061,762
UNIVERSAL LEAD MOUNTING

Robert E. Schlegel, Van Nuys, Calif., assignor to Rytron Company, Inc., North Hollywood, Calif., a corporation of California Filed June 7, 1960, Ser. No. 34,502
4 Claims. (Cl. 317—101)

This invention relates to electrical circuit connecting means and particularly to improved connection constructions for enclosed circuit components having wire leads and which are adaptable to a variety of installation requirements.

As is well known to those skilled in the art, considerable effort has been directed to the miniaturization and subminiaturization of electronic assemblies. In furtherance of this effort, widespread use has been made of printed or etched circuits as well as encapsulating and potting techniques. To optimize the benefits of these techniques it is, of course, necessary to reduce the size of the circuit components and mechanical assemblies as far as is possible within practical limits. The importance of size, is particularly significant in regards to mechanical and/or physical characteristics of terminal structures and other means for making the necessary electrical interconnections between circuit components. Frequently this has led to specialized connecting means which are suited to only specific installation conditions. For example, miniature components for use in printed circuits are usually arranged so that the electrical connections are made through lead wires or terminals which will mate directly with the printed circuit conductors when the component is mounted on the printed circuit board or panel. In some instances the leads are arranged to pass through holes, transverse of the printed circuit board, for solder connection to printed conductors on the side of the board opposite from the side on which the component is mounted. Typically, such leads comprise pins, wires, or projections which extend through holes in the circuit board. Alternatively, terminals are brought out from the side of the component for connection to conductors lying on the same side of the board to which the component is attached. Such terminals are not suitable for connection to conductors on either side of the board. To meet the requirements of these alternative mounting configurations, it has, heretofore, been necessary for manufacturers of components to provide various styles of leads.

To overcome the above limitations, and to provide a miniaturized universal connector means, there is provided by the present invention terminal means extending from the juncture between adjoining surfaces of the component housing for completing electrical connections between the component and circuits carried by the panel or other structure used to support the component. The invention also contemplates the provision of apertures having adjoining relieved areas located at the edge or seam of perpendicular surfaces of the component housing through which conductors may be withdrawn from any desired angle.

It is therefore, an object of the invention to provide a universal mounting terminal.

It is another object of the invention to provide ultra-compact electrical connection means for miniaturized components.

It is another object of the invention to provide novel and improved terminal means for enclosed electronic components.

A further object of the invention is to provide lead wires for a circuit component which may have a molded housing and in which the lead wires extend radially outward from the corner of the base of the housing.

These and other objects of the invention will be more clearly understood from the following detailed description thereof when read in conjunction with the drawings, in which.

Figures 1, 2, 3, 4, 5, 6, 7, 8, 9:
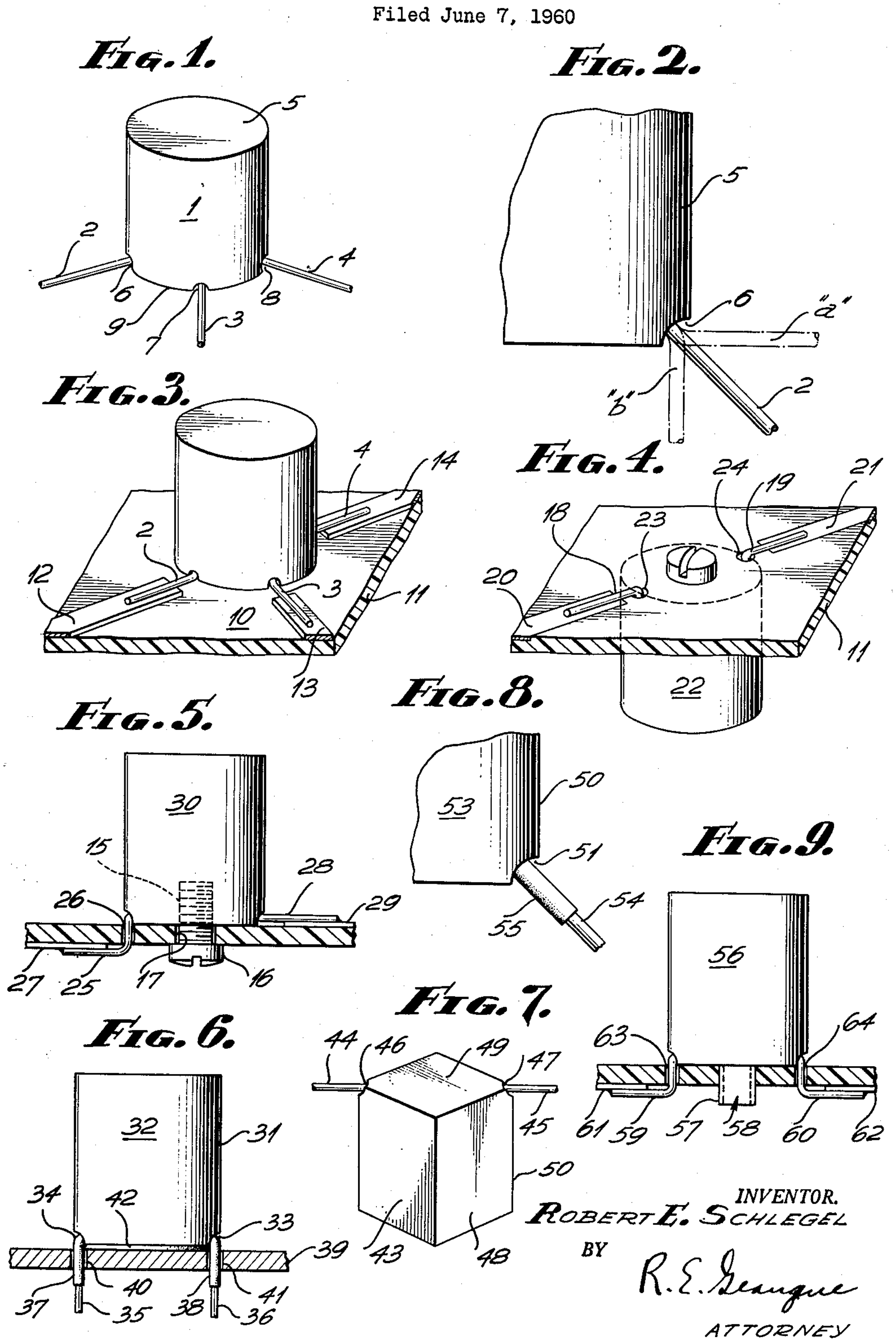
FIGURE 1 is a perspective view of one embodiment of the invention.
FIGURE 2 is a detailed view illustrating an uninsulated lead wire according to the invention for communicating the interior with the exterior of the component.
FIGURE 3 is a perspective view illustrating the manner in which the apparatus of FIGURE 1 is installed to communicate with circuits of the first surface of a printed circuit board.
FIGURE 4 is a fragmentary perspective view illustrating electrical connections on the side of a circuit board opposite the side mounting the circuit component.
FIGURE 5 is a sectional view illustrating an embodiment of the invention employing screw fastening means.
FIGURE 6 is a sectional view showing adhesive bonding of a component employing the present invention.
FIGURE 7 illustrates a component, according to the invention, having a rectangular housing.
FIGURE 8 is a detailed view illustrating an insulated lead wire as may be employed in the present invention.
FIGURE 9 is an elevational view, partially in section, illustrating electrical connections made to the lower surfaces of a circuit board.

Looking now at FIGURE 1, there is shown an enclosed electronic circuit component 1 having multiple electrical connection leads 2, 3 and 4 extending radially therefrom. The enclosed component 1 may be an inductor, a resistor, a capacitor or other circuit element and the enclosure 5 may have a variety of shapes, for example, cylindrical, rectangular, etc. It should be understood that the enclosure may be defined by a series of contiguous walls such as a can or box, or may envelop the component as in the case of potted, cast or encapsulated elements. In this latter case there would, of course, not be any partitioning wall members defining the enclosure. Usual practice, heretofore, has been to bring the leads from the component housing directly through apertures in the base of the enclosure. This would require that clearance be provided under the base of the component if the leads are to be made accessible for connection to circuit conductors on the upper side of the printed circuit board. Usual practice, heretofore, has been to have the leads constructed to have a certain amount of flexibility so that if strains are placed upon the printed circuit board, as commonly occurs while the boards are being inserted into or withdrawn from mating connectors, the solder joints will not be apt to break. These leads, however, have been brought out from component housing at various points without particular regard to the optimum mounting considerations. In the present invention, the wiring leads 2–4 are withdrawn from the housing through apertures 6–8 at the base edge 9, that is, the corner, seam or juncture between the exterior surfaces of the housing. This exit point for lead wires is the optimum compromise between apertures in exterior side surfaces and the base surface.

Miniaturized electronic circuits typically employ a printed or etched circuit panel 10, as shown in FIGURE 3, wherein the conductors 12–14 are formed on a plate of insulating material 11, hereinafter referred to as a printed circuit board. In many instances metallic conductors are formed on both surfaces of the board thereby requiring electrical connection to be made to components on each side of the board.

Leads 2–4 from the component 1 are arranged to contact the conductors 12–14, respectively, formed on the board 11. Appropriate means such as soldering may be employed to secure said leads to said printed circuit conductors.

By placing the lead 2 and opening 6 at the edge or juncture between adjacent surfaces, as shown in FIGURE 2, the lead may be bent or formed to adapt it to surface connection as shown at "*a*," or to sub-panel connection as shown at "*b*."

There is shown in FIGURES 4 and 5 embodiments of the invention in which means for fastening the components to the printed circuit board are shown. The components in these instances are provided with a tapped hole 15 for receiving fastening screw 16. The board 11 is provided with aperture 17 through which fastening screw 16 may pass. It should be understood, however, that various other fastening means may be employed in lieu of a screw 16. For example, tubular rivets may be employed to attach the component to the board. Also, the component may employ formable prongs or extension tabs which may be twisted or bent to provide fastening engagement with the board as will be readily understood by those skilled in the art. In either instance, the mounting screw, rivet, or the like, may be employed as a ground terminal or other circuit conductor to the component, in addition to its use as a fastening means.

Looking now at FIGURE 4 there is shown the manner in which leads 18 and 19 may be made to communicate with printed circuit conductors 20 and 21 respectively, the latter being located on the side of board 11 opposite from the side carrying the component 22. Apertures 23 and 24 are drilled or punched through board 11 in registration with the points at which leads 18 and 19 extend from component 22. Upon emerging from apertures 23 and 24, respectively, leads 18 and 19 may be selectively bent to engage mating conductors 20 and 21 and thereafter joined to the conductors by soldering, welding, etc.

Looking now at FIGURE 5 there is shown the manner in which circuit connections can be made to both sides of a printed circuit board from a single component. Lead 25 extends through aperture 26 and is formed to engage printed circuit conductor 27 on one side of board 11 whereas lead 28 is formed to engage printed circuit conductor 29 on the opposite side of board 11. It will be obvious that lead 28 could have been interchanged with lead 25 to permit its mating with conductor 27, and thereby permit lead 25 to have been mated with conductor 29, merely by rotating component 30 through 180° about the axis of fastening screw 16. This illustrates the flexibility of the lead mounting of the present invention as adaptable to a variety of installation conditions.

In the embodiment discussed above, the lead wires from the component have been shown without exterior or covering insulation, uninsulated wires being especially suitable for use with component housings of a dielectric material such as epoxy resin or other plastic material. In certain instances, however, it may be desirable to employ a component housing made of metal. In such instances, it becomes desirable to provide the lead wires communicating the interior of the component housing with the exterior of the housing, with insulation in order to obviate having grommets or insulating inserts through which the lead wires must pass. Housing 31 of component 32 may be of metal and may be provided with cutouts or relieved areas 33 and 34. Lead wires 35 and 36 are provided with exterior insulation covering 37 and 38, respectively. The insulation may be an extruded plastic covering or may be a braided fabric cover as is commonly used to insulate wire leads. Panel 39 may, in this instance, be made of metal rather than a dielectric material as in the case of circuit boards previously discussed, since insulation 37 and 38 will prevent shorting of leads 35 and 36 with panel 39 as it passes through apertures 40 and 41, respectively.

Component 32 may be attached to panel 39 by a layer of adhesive 42 or by other suitable bonding means. Epoxy adhesives are particularly suitable for this application. It should be understood that adhesive bonding is not necessarily limited to metal enclosures as shown in 31 but also may be employed in the case of nonmetallic (i.e., plastic) enclosures as discussed in preceding paragraphs.

There is shown in FIGURE 7 an embodiment of the invention in which the component is housed in a rectangular enclosure 43. In this instance it is deemed preferable to withdraw lead wires 44 and 45 through apertures 46 and 47 located at the juncture of three surfaces, namely 48–50, of the enclosure rather than the juncture of two surfaces of the enclosure as necessarily exists in the case of cylindrical enclosures. This will permit optimum selectivity in forming or positioning the conductors 44 and 45 in relation to exterior circuit conductors.

In those instances in which an insulated lead wire is employed, it is particularly desirable to provide a relieved area at the juncture between adjoining surfaces of the component enclosure. The radius of the relieved area 51 at the juncture between surfaces 49 and 50 of enclosure 53 should be only sufficient to allow clearance of lead wire 54 and insulation 55 as it is selectively moved through a 270° solid angle exteriorly of enclosure 53. Assuming that the enclosure is of a dielectric material as would result in the case of an encapsulated component, a bare lead wire may be brought out directly from the juncture of the surfaces of the enclosure without the necessity of providing a relieved area.

There is shown in FIGURE 9 means for attaching a component 56 to board 11 wherein it may be desirable to provide access to the interior of the component 56 for making various types of adjustments. Stud 57 is hollow thereby permitting a tool to be inserted through central opening 58 to adjust elements within component 56. Such facility would be applicable to tuned inductors, Since access to side 52 of the board 11 is necessary to make tuning adjustments, it may also be desirable to have all electrical connections mate to this same side (i.e. 52) of board 11. Thus, leads 59 and 60 passing through apertures 63 and 64, respectively, may be adapted to communicate with conductors 61 and 62 on side 52 of board 11; side 52 being opposite from the side on the board which component 56 is mounted.

It should be noted that in each of the above-described embodiments it is unnecessary to employ special tools to install the component or adapt its leads to conform to various external circuit conductors.

Various modifications, within the intended scope of the invention, will be obvious to those skilled in the art. For example, the leads extending from the component need not be limited to wires of circular cross section but may be any integral conductive extension to which exterior and/or ancillary conductors may be attached. Nor, need the invention be limited to applications in printed or etched circuits since it is likewise suitable for use in circuits employing conventional terminal boards, taped assemblies and/or chassis mounting. Furthermore, it should be understood that the universal lead mounting of the invention is not limited by the nature of the component with which it communicates; for example, the cylindrical housing of FIGURE 1 may enclose a socket for an electron tube or semi-conductor device. For these reasons, it is intended that the scope of the present invention be not limited to the foregoing disclosure, but rather only by the appended claims.

What is claimed is:

1. In combination, a housing containing an electrical component, a lead wire for said component, a planar circuit panel supporting said housing, said housing having a flat bottom surface and a side surface forming an angular juncture therebetween, said bottom surface lying adjacent a surface of said circuit panel, said juncture having an aperture communicating the interior with the exterior of said housing, and a conductor carried on said circuit panel, said lead wire being disposed through said aperture and having one end connected to said component and having the other end connected to said conductor.

2. The combination as defined in claim 1 wherein said juncture is relieved at said aperture to provide arcuate clearance in both said bottom and side surfaces to permit said lead wire to extend from said housing without increasing the space required for said housing through which said other end of said lead wire may be selectively disposed.

3. In combination, a housing having circuit means within said housing, planar circuit panel means exterior of said housing having a conductor carried thereon and a lead wire between said circuit means and said conductor, said housing having a planar base surface and at least one exterior side surface perpendicular to said base surface and forming a juncture therebetween, said juncture having an aperture communicating the interior of said housing with the exterior of said housing, said lead wire being disposed through said aperture.

4. The combination as defined in claim 3 wherein said housing comprises a hollow container a portion of the bottom and side walls of which are relieved to provide said aperture, said relieved aperture permitting said lead wire to extend from said housing so as to lie within an area defined by a plane extending from one of said walls.

References Cited in the file of this patent

UNITED STATES PATENTS 2,204,204 Baier ---------- June 11, 1940
2,858,407 Hykes ---------- Oct. 28, 1958

FOREIGN PATENTS 1,059,521 Germany ---------- June 18, 1959